(12) United States Patent
Yun

(10) Patent No.: US 8,629,949 B2
(45) Date of Patent: Jan. 14, 2014

(54) LIQUID CRYSTAL DISPLAY AND METHOD OF FORMING THE SAME

(75) Inventor: Dae-Seung Yun, Suwon (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 67 days.

(21) Appl. No.: 13/204,886

(22) Filed: Aug. 8, 2011

(65) Prior Publication Data

US 2012/0140155 A1 Jun. 7, 2012

(30) Foreign Application Priority Data

Dec. 2, 2010 (KR) .......................... 10-2010-0122287

(51) Int. Cl.
*G02F 1/136* (2006.01)

(52) U.S. Cl.
USPC .............................. 349/42; 349/138; 349/141

(58) Field of Classification Search
None
See application file for complete search history.

(56) References Cited

U.S. PATENT DOCUMENTS

| 6,522,369 B2* | 2/2003 | Ohta et al. ................. 349/141 |
| 8,189,157 B2* | 5/2012 | Watanabe et al. ............ 349/139 |
| 2007/0024789 A1* | 2/2007 | Itou et al. .................. 349/139 |
| 2010/0051935 A1 | 3/2010 | Lee et al. |

FOREIGN PATENT DOCUMENTS

| KR | 10-2007-0001564 | 1/2007 |
| KR | 10-2008-0050679 | 6/2008 |
| KR | 10-2010-0025837 | 3/2010 |

\* cited by examiner

*Primary Examiner* — Richard Kim
(74) *Attorney, Agent, or Firm* — Robert E. Bushnell, Esq.

(57) ABSTRACT

A liquid crystal display and a method of forming the same are disclosed. The method of forming the liquid crystal display comprises: forming a gate electrode and a common electrode on a substrate; forming a gate dielectric, which covers the gate electrode and the common electrode, on the substrate; forming a channel layer, which covers the gate electrode, on the gate dielectric; forming a source electrode and a drain electrode which expose a portion of the channel layer; forming an organic layer, which contacts the exposed portion of the channel layer, on the source electrode and the drain electrode; patterning the organic layer contacting the channel layer so as to form an organic layer pattern comprising a first opening which exposes the channel layer; and forming an inorganic insulation layer which covers the channel layer exposed by the first opening.

12 Claims, 3 Drawing Sheets

LIQUID CRYSTAL DISPLAY AND METHOD OF FORMING THE SAME

CLAIM OF PRIORITY

This application makes reference to, incorporates the same herein, and claims all benefits accruing under 35 U.S.C. §119 from an application earlier filed in the Korean Intellectual Property Office on the 2 Dec. 2010 and there duly assigned Serial No. 10-2010-0122287.

BACKGROUND OF THE INVENTION

1. Field of the Invention

The present invention relates to a liquid crystal display and a method of forming the same, and more particularly, to a liquid crystal display driven in an In-Plane-Switching (IPS) mode and a method of forming the same.

2. Description of the Related Art

A liquid crystal display (LCD) is a type of flat panel display which is most widely used. The LCD includes two substrates on which electrodes are formed, and a liquid crystal layer inserted therebetween. The LCD realigns the liquid crystal molecules of the liquid crystal layer by applying voltages to the electrodes, thereby controlling the amount of transmitted light.

It is easy to thin LCDs, which have relatively small power consumption. The LCDs do not generate electromagnetic waves harmful to the human body. In the LCDs, however, front visibility is degraded compared to side visibility. Various liquid crystal aligning and driving methods are being developed for realizing a wide angle of view. A Patterned Vertically Aligned (PVA) mode which applies a domain divider to an LCD using a Vertical Alignment (VA) mode, an IPS mode and a Plane-to-Line Switching (PLS) mode are being proposed as methods for realizing the wide angle of view.

SUMMARY OF THE INVENTION

The present invention comprises a liquid crystal display with enhanced interface characteristics and a method of forming the same.

Embodiments of the inventive concept relate to a method of forming a liquid crystal display, the method comprising: forming a gate electrode and a common electrode on a substrate; forming a gate dielectric, which covers the gate electrode and the common electrode, on the substrate; forming a channel layer, which covers the gate electrode, on the gate dielectric; forming a source electrode and a drain electrode which expose a portion of the channel layer; forming an organic layer, which contacts the exposed portion of the channel layer, on the source electrode and the drain electrode; patterning the organic layer contacting the channel layer so as to form an organic layer pattern including a first opening which exposes the channel layer; and forming an inorganic insulation layer which covers the channel layer exposed by the first opening.

In some embodiments, the organic layer may be formed by a spin coating process.

In other embodiments, the inorganic insulation layer may be formed by a Chemical Vapor Deposition (CVD) process.

In still other embodiments, the method may further include forming a pixel electrode which is disposed between the organic layer pattern and the inorganic insulation layer, and which is electrically connected to the drain electrode.

In further embodiments, the method may also include forming a common voltage line, which is electrically connected to the common electrode, on the inorganic insulation layer.

In other embodiments of the inventive concept, a liquid crystal display comprises: a gate electrode disposed on a first substrate; a gate dielectric disposed on the gate electrode; a channel layer disposed on the gate dielectric; a source electrode and a drain electrode respectively covering partial portions of the channel layer; an organic layer pattern covering the source electrode and the drain electrode, and exposing the channel layer; and an inorganic insulation layer contacting the exposed channel layer, and covering the organic layer pattern.

In some embodiments, the liquid crystal display may further include a pixel electrode disposed between the organic layer pattern and the inorganic insulation layer, and electrically connected to the drain electrode.

In other embodiments, the liquid crystal display may further include: a common electrode disposed between the first substrate and the gate dielectric; and a common voltage line disposed on the inorganic insulation layer and electrically connected to the common electrode.

In still other embodiments, the liquid crystal display may further include: a second substrate facing the first substrate; a liquid crystal layer disposed between the first and second substrates; a color filter layer disposed between the liquid crystal layer and the second substrate; and a black matrix disposed between the color filter layer and the second substrate, and covering the channel layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
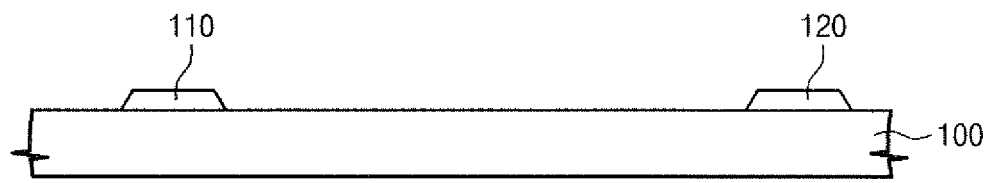
FIGS. 1 thru 7 are cross-sectional views illustrating a method of forming a liquid crystal display according to an embodiment of the present invention.

Exemplary embodiments of the inventive concept of the present invention will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

In the specification, it will be understood that, when an element is referred to as being 'on' another element, it can be directly on the other element, or intervening elements may also be present. Also, in the figures, the dimensions of layers and regions are exaggerated for clarity of illustration. Like reference numerals refer to like elements throughout the specification.

Additionally, the embodiment in the detailed description will be described with sectional views as ideal exemplary views of the present invention. In the figures, the dimensions of layers and regions are exaggerated for clarity of illustration. Accordingly, shapes of the exemplary views may be modified according to manufacturing techniques and/or allowable errors. Therefore, the embodiments of the present invention are not limited to the specific shape illustrated in the exemplary views, but may include other shapes which may be created according to manufacturing processes. Also, although terms like "a first", "a second", and "a third" are used to describe various regions and layers in various embodiments of the present invention, the regions and the layers are not limited to these terms. These terms are used only to differentiate one region or layer from another region or layer. An embodiment described and exemplified herein includes a complementary embodiment thereof.

In the following description, technical terms are used only to explain a specific exemplary embodiment while not limiting the present invention. The term "a singular form" may include plural forms unless indicated to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

FIGS. 1 thru 7 are cross-sectional views illustrating a method of forming a liquid crystal display according to an embodiment of the present invention.

Referring to FIG. 1, a gate electrode 110 and a common electrode 120 are formed on a substrate 100. The substrate 100 may be formed as a glass substrate. The gate electrode 110 and the common electrode 120 may be formed of a metal material, for example, aluminum (Al), silver (Ag), copper (Cu), molybdenum (Mo), chromium (Cr), titanium (Ti) or tantalum (Ta).

Figure 2:
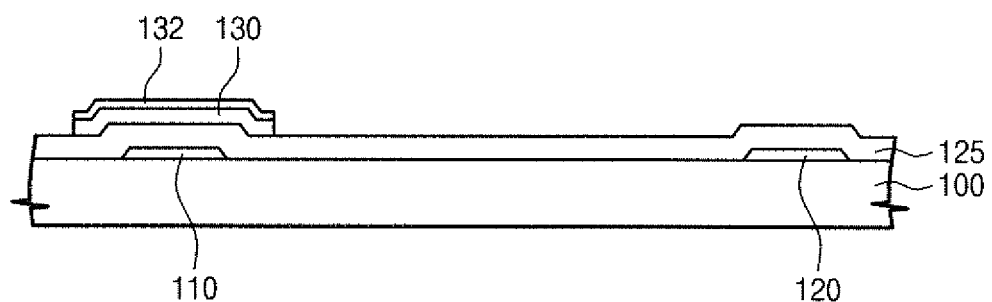

Referring to FIG. 2, a gate dielectric 125 covering the gate electrode 110 and the common electrode 120 is formed on the substrate 100. The gate dielectric 125 may be formed of an insulating material, for example, silicon nitride or silicon oxide. A channel layer 130 covering the gate electrode 110 is formed on the gate dielectric 125. The channel layer 130 may be formed of a semiconductor material, for example, amorphous silicon. An auxiliary ohmic contact layer 132 is formed on the channel layer 130. The auxiliary ohmic contact layer 132 may be formed of amorphous silicon including an n-type dopant.

Figure 3:
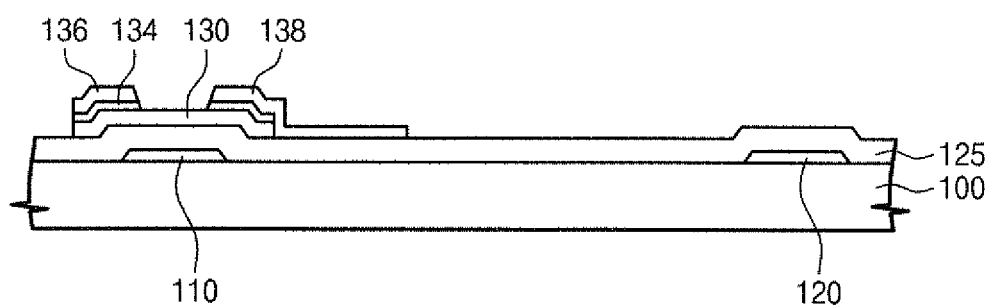

Referring to FIG. 3, a source electrode 136 and a drain electrode 138 are formed on the auxiliary ohmic contact layer 132. The source electrode 136 and the drain electrode 138 may be formed of a metal material, for example, Cr or the like. Forming the source electrode 136 and the drain electrode 138 may include patterning the auxiliary ohmic contact layer 132 to form an ohmic contact layer 134. The ohmic contact layer 134 may be formed between the source electrode 136 and the channel layer 130, and between the drain electrode 138 and the channel layer 130. As a result, the source electrode 136, the drain electrode 138 and the ohmic contact layer 134 are formed so that a portion of the channel layer 130 is exposed.

Figure 4:
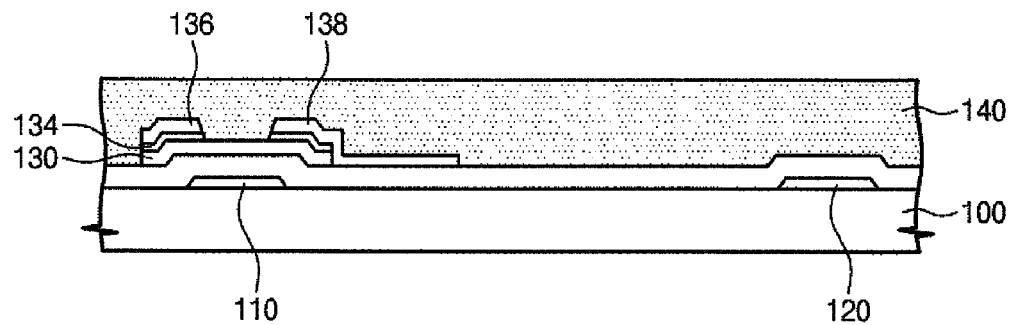

Referring to FIG. 4, an organic layer 140 contacting the exposed portion of the channel layer 130 is formed over the substrate 100. The organic layer 140 may have excellent planarization characteristics, and may be formed of a material having photosensitivity. The organic layer 140 may be formed by a spin coating process or a slit coating process, or may be formed by simultaneously using the spin coating process and the slit coating process. The organic layer 140 may be formed so as to have a flat upper surface. When an inorganic insulation layer is formed without forming the organic layer 140 over the substrate 100, since the inorganic insulation layer is formed by a Chemical Vapor Deposition (CVD) process, the process time is relatively long. Also, stress is imposed on the inorganic insulation layer, and thus the substrate 100 may be bent. According to an embodiment of the present invention, since the organic layer 140 is formed over the substrate 100 by the spin coating process, the process time can be shortened, and stress may not be imposed on the substrate 100.

Figure 5:
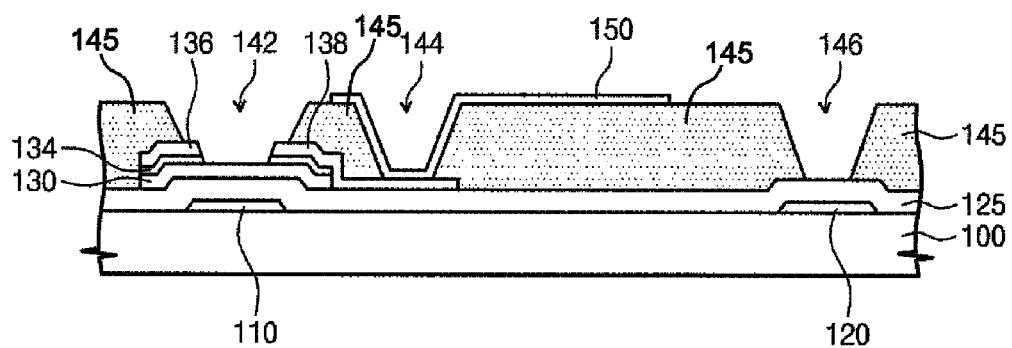

Referring to FIG. 5, by patterning the organic layer 140 which contacts the channel layer 130, an organic layer pattern 145 having a first opening 142 for exposing the channel layer 130 is formed. When the organic layer pattern 145 contacts the channel layer 130, stability of an interface state between the organic layer pattern 145 and the channel layer 130 can be reduced, and characteristics of a thin film transistor may be degraded by forming unstable coupling, for example, a dangling bond. According to an embodiment of the invention, the organic layer pattern 145 does not contact the top of the channel layer 130. Therefore, interface characteristics of the channel layer 130 can be enhanced.

The organic layer pattern 145 may have a second opening 144 for exposing the drain electrode 138, and a third opening 146 for exposing the gate dielectric 125 on the common electrode 120. A pixel electrode 150, electrically connected to the drain electrode 138, is formed on the organic layer pattern 145. The pixel electrode 150 may be formed of Indium Tin Oxide (ITO) or Indium Zinc Oxide (IZO) having transparency. The pixel electrode 150 may be electrically connected to the drain electrode 138, which is exposed by the second opening 144.

Figure 6:
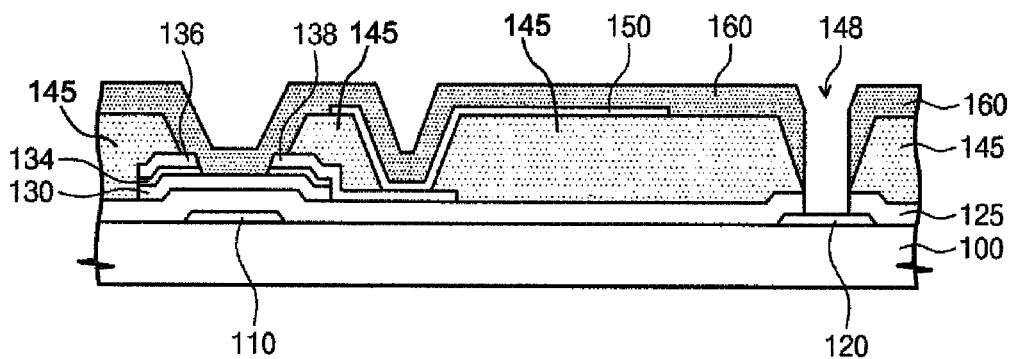

Referring to FIG. 6, an inorganic insulation layer 160 covering the channel layer 130, which is exposed by the first opening 142, is formed. The inorganic insulation layer 160 may be formed of silicon nitride or silicon oxide. As a result, the pixel electrode 150 is disposed between the organic layer pattern 145 and the inorganic insulation layer 160. The inorganic insulation layer 160 may be formed by the CVD process. A fourth opening 148 for exposing the common electrode 120 is formed by patterning the inorganic insulation layer 160 and the gate dielectric 125.

Figure 7:
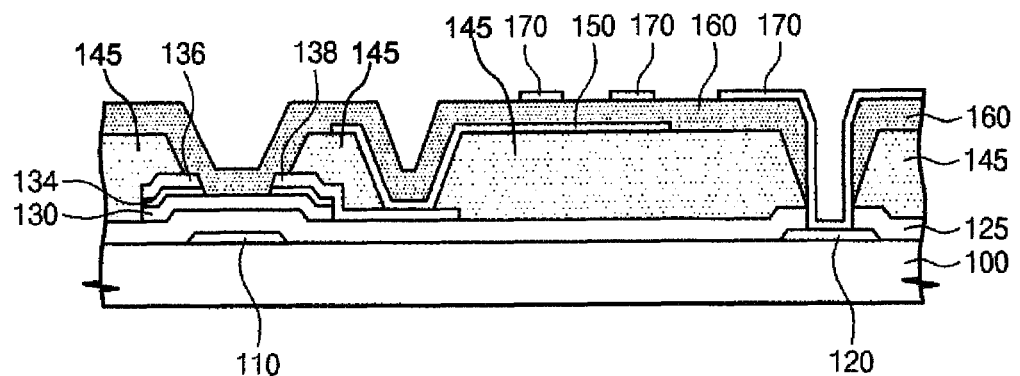

Referring to FIG. 7, a common voltage line 170 electrically connected to the common electrode 120 is formed on the inorganic insulation layer 160. The common voltage line 170 contacts the common electrode 120 which is exposed by the fourth opening 148. The common voltage line 170 may be formed of ITO or IZO having transparency. The aligned direction of liquid crystal molecules may be controlled by a horizontal electric field which is generated by the pixel electrode 150 and the common voltage line 170.

According to an embodiment of the invention, the organic layer pattern 145 exposing the channel layer 130 is formed, and thereafter the inorganic insulation layer 160 is formed on the organic layer pattern 145. Since the organic layer pattern 145 is formed by the spin process, process time is shortened, and the substrate 100 cannot be modified. To secure the aperture ratio of the liquid crystal display, the organic layer pattern 145 may cover a metal line, for example, all or a portion of a data line (not shown) or a gate line (not shown). The organic layer pattern 145 has a dielectric constant lower than that of the inorganic insulation layer 160, and thus a parasitic capacitance can be reduced. Furthermore, since the inorganic insulation layer 160 contacts the channel layer 130, characteristics of the thin film transistor can be prevented from being degraded.

Figure 8:
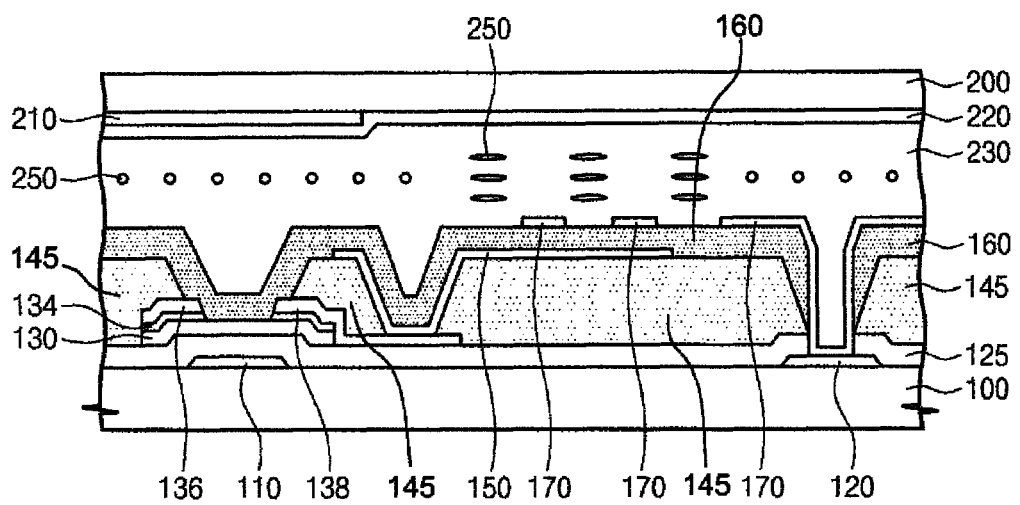
FIG. 8 is a cross-sectional view illustrating a liquid crystal display according to an embodiment of the present invention.

FIG. 8 is a cross-sectional view illustrating a liquid crystal display according to an embodiment of the present invention.

For conciseness, the technical features that have been described above with reference to FIGS. 1 to 7 will be omitted.

Referring to FIG. 8, a gate electrode 110 and a common electrode 120 are formed on the first substrate 100. The first substrate 100 may be formed as a glass substrate. The gate electrode 110 and the common electrode 120 may be formed of a metal material, for example, aluminum (Al), silver (Ag), copper (Cu), molybdenum (Mo), chromium (Cr), titanium (Ti) or tantalum (Ta). A gate dielectric 125 covering the gate electrode 110 and the common electrode 120 is formed on the first substrate 100. The gate dielectric 125 may be formed of silicon nitride or silicon oxide.

A channel layer 130 covering the gate electrode 110 is formed on the gate dielectric 125. The channel layer 130 may be formed of a semiconductor material, for example, amorphous silicon. An ohmic contact layer 134 covering the channel layer 130 is formed on the channel layer 130. The ohmic contact layer 134 may include amorphous silicon including an n-type dopant.

A source electrode 136 and a drain electrode 138 are formed on the ohmic contact layer 134. The source electrode 136 and the drain electrode 138 may be formed of a metal material, for example, Cr or the like. The source electrode 136, the drain electrode 138 and the ohmic contact layer 134 are formed in such a manner that a portion of the channel layer 130 is exposed.

An organic layer pattern 145, which covers the source electrode 136 and the drain electrode 138 and exposes the channel layer 130, is disposed. The organic layer pattern 145 may have excellent planarization characteristics, and may include a material having photosensitivity. An inorganic insulation layer 160, which contacts the exposed portion of the channel layer 130 and covers the organic layer pattern 145, is disposed. The inorganic insulation layer 160 may include silicon nitride or silicon oxide.

When the organic layer pattern 145 contacts the channel layer 130, stability of an interface state between the organic layer pattern 145 and the channel layer 130 can be reduced, and characteristics of a thin film transistor may be degraded by forming unstable coupling, for example, a dangling bond. According to an embodiment of the invention, the organic layer pattern 145 does not contact the top of the channel layer 130, but the inorganic insulation layer 160 contacts the exposed portion of the channel layer 130. Therefore, interface characteristics of the channel layer 130 can be enhanced.

A pixel electrode 150 is disposed between the organic layer pattern 145 and the inorganic insulation layer 160. The pixel electrode 150 is electrically connected to the drain electrode 138 which is exposed by the organic layer pattern 145. The pixel electrode 150 may include Indium Tin Oxide (ITO) or Indium Zinc Oxide (IZO) having transparency.

The inorganic insulation layer 160 and the gate dielectric 125 expose the common electrode 120. A common voltage line 170 electrically connected to the exposed common electrode 120 is disposed on the inorganic insulation layer 160. The common voltage line 170 may include Indium Tin Oxide (ITO) or Indium Zinc Oxide (IZO) having transparency.

A second substrate 200 facing the first substrate 100 is disposed. The second substrate 200 may include the same material as that of the first substrate 100. A liquid crystal layer 230 is disposed between the first and second substrates 100 and 200, respectively. The liquid crystal layer 230 includes liquid crystal molecules 250. A color filter layer 220 is disposed between the liquid crystal layer 230 and the second substrate 200. The color filter layer 220 may include materials containing dyes which realize red, green and blue.

A black matrix 210 covering the channel layer 130 is disposed between the color filter layer 220 and the second substrate 200. The black matrix 210 may include a carbon-based organic material. The black matrix 210 can prevent a light leakage current from being generated due to electron excitation which occurs as a result of light in a thin film transistor. The aligned direction of the liquid crystal molecules 250 may be controlled by a horizontal electric field which is generated by the pixel electrode 150 and the common voltage line 170. The horizontal electric field may twist the liquid crystal molecules 250 in a horizontal direction.

According to an embodiment of the invention, the inorganic insulation layer 160 which covers the organic layer pattern 145 exposing the channel layer 130, and which contacts the exposed channel layer 130, is disposed. To secure the aperture ratio of the liquid crystal display, the organic layer pattern 145 may cover a metal line, for example, all or a portion of a data line (not shown) or a gate line (not shown). The organic layer pattern 145 has a dielectric constant which is lower than that of the inorganic insulation layer 160, and thus a parasitic capacitance can be reduced. Furthermore, since the inorganic insulation layer 160 contacts the channel layer 130, characteristics of the thin film transistor can be prevented from being degraded.

According to the embodiments of the invention, the organic layer pattern exposing the channel layer is formed, and the inorganic insulation layer contacting the channel layer is formed on the organic layer pattern. Since the organic layer pattern is formed by the spin process, the process time is shortened, and the substrate cannot be modified. The organic layer pattern has a dielectric constant which is lower than that of the inorganic insulation layer, and thus the parasitic capacitance can be reduced in a portion covering the metal lines. Furthermore, since the inorganic insulation layer contacts the channel layer, characteristics of the thin film transistor can be prevented from being degraded.

The above-disclosed subject matter is to be considered illustrative and not restrictive, and the appended claims are intended to cover all such modifications, enhancements, and other embodiments which fall within the true spirit and scope of the invention. Thus, to the maximum extent allowed by law, the scope of the invention is to be determined by the broadest permissible interpretation of the following claims and their equivalents, and shall not be restricted or limited by the foregoing detailed description.

What is claimed is:

1. A method of forming a liquid crystal display device, the method comprising the steps of:

forming a gate electrode and a common electrode on a substrate;

forming a gate dielectric, which covers the gate electrode and the common electrode, on the substrate;

forming a channel layer, which covers the gate electrode, on the gate dielectric;

forming a source electrode and a drain electrode which expose a portion of the channel layer;

forming an organic layer, which contacts the exposed portion of the channel layer, on the source electrode and the drain electrode;

patterning the organic layer contacting the channel layer so as to form an organic layer pattern comprising a first opening which exposes the channel layer and a second opening which exposes a portion of the gate dielectric on the common electrode;

forming an inorganic insulation layer which covers the channel layer exposed by the first opening; and forming a common voltage line, which is electrically connected to the common electrode, on the inorganic insulation layer.

2. The method of claim 1, wherein the organic layer is formed by a spin coating process.

3. The method of claim 1, wherein the inorganic insulation layer is formed by a Chemical Vapor Deposition (CVD) process.

4. The method of claim 1, further comprising the step of forming a pixel electrode which is disposed between the organic layer pattern and the inorganic insulation layer, and which is electrically connected to the drain electrode.

5. The method of claim 1, further comprising the step of patterning the inorganic insulation layer and the exposed portion of the gate dielectric so as to form a third opening which exposes a portion of the common electrode.

6. A liquid crystal display device fabricated by the method of claim 1, further comprising a pixel electrode disposed between the organic layer pattern and the inorganic insulation layer, and electrically connected to the drain electrode.

7. A liquid crystal display device fabricated by the method of claim 1, further comprising:
 the substrate bearing the gate electrode and the common electrode comprising a first substrate;
 a second substrate facing the first substrate;
 a liquid crystal layer disposed between the first and second substrates;
 a color filter layer disposed between the liquid crystal layer and the second substrate; and
 a black matrix covering the channel layer, and disposed between the color filter layer and the second substrate.

8. A liquid crystal display device fabricated by the method of claim 1, further comprising:
 a pixel electrode disposed between the organic layer pattern and the inorganic insulation layer, and electrically connected to the drain electrode;
 the substrate bearing the gate electrode and the common electrode comprising a first substrate;
 a second substrate facing the first substrate;
 a liquid crystal layer disposed between the first and second substrates;
 a color filter layer disposed between the liquid crystal layer and the second substrate; and
 a black matrix covering the channel layer, and disposed between the color filter layer and the second substrate.

9. A liquid crystal display device, comprising:
 a gate electrode disposed on a first substrate;
 a gate dielectric disposed on the gate electrode;
 a channel layer disposed on the gate dielectric;
 a source electrode and a drain electrode covering partial portions of the channel layer, respectively;
 a common electrode disposed between the first substrate and the gate dielectric;
 an organic layer pattern covering the source electrode and the drain electrode, and exposing the channel layer and a portion of the gate dielectric on the common electrode;
 an inorganic insulation layer contacting the exposed channel layer, and covering the organic layer pattern; and
 a common voltage line electrically connected to the common electrode, and disposed on the inorganic insulation layer.

10. The liquid crystal display device of claim 9, further comprising a pixel electrode disposed between the organic layer pattern and the inorganic insulation layer, and electrically connected to the drain electrode.

11. The liquid crystal display device of claim 9, further comprising:
 a second substrate facing the first substrate;
 a liquid crystal layer disposed between the first and second substrates;
 a color filter layer disposed between the liquid crystal layer and the second substrate; and
 a black matrix covering the channel layer, and disposed between the color filter layer and the second substrate.

12. The liquid crystal display device of claim 9, further comprising:
 a first opening that exposes the channel layer; and
 the inorganic insulation layer covering the channel layer exposed by the first opening.

* * * * *